United States Patent [19]

Etter

[11] Patent Number: 5,663,858
[45] Date of Patent: Sep. 2, 1997

[54] METHOD FOR FAULT CORRECTION IN A POWER CONVERTER CIRCUIT ARRANGEMENT

[75] Inventor: Peter Etter, Oberehrendingen, Switzerland

[73] Assignee: Asea Brown Boveri AG, Baden, Switzerland

[21] Appl. No.: 520,589

[22] Filed: Aug. 30, 1995

[30] Foreign Application Priority Data

Oct. 1, 1994 [DE] Germany .................. 44 35 255.7

[51] Int. Cl.⁶ .................................................. H02H 5/04
[52] U.S. Cl. .............................. 361/28; 361/31; 361/98; 363/56
[58] Field of Search .......................... 363/56; 361/23–25, 361/28, 31, 33, 93–94, 98, 100–101, 103–104

[56] References Cited

U.S. PATENT DOCUMENTS 4,819,157  4/1989  Hirose et al. ..................... 363/56
5,123,746  6/1992  Okado .............................. 363/37
5,499,186  3/1996  Carosa ............................ 363/132

FOREIGN PATENT DOCUMENTS

0554195 A1  8/1993  European Pat. Off. .

*Primary Examiner*—Jeffrey A. Gaffin
*Assistant Examiner*—Michael J. Sherry
*Attorney, Agent, or Firm*—Oblon, Spivak, McClelland, Maier & Neustadt, P.C.

[57] ABSTRACT

A method for fault correction in a power converter circuit arrangement. The power converter circuit arrangement has a plurality of switch modules which consist, for their part, of a parallel circuit of semiconductor chips. The semiconductor chips are interconnected via connecting wires, preferably bonding wires. If, because of a defect, a chip forms a short circuit, the connecting wires of chip are severed by specific current pulses. The advantage resides in that a short circuit of an individual chip does not put the entire circuit arrangement out of operation.

12 Claims, 2 Drawing Sheets

METHOD FOR FAULT CORRECTION IN A POWER CONVERTER CIRCUIT ARRANGEMENT

BACKGROUND OF THE INVENTION

1. Field of the invention

The invention relates to the field of power electronics.

It relates to a method for fault correction in a power converter circuit arrangement according to the preamble of the first claim.

2. Discussion of Background

The article "Moderne Leistungshalbleiter in der Stromrichtertechnik" [Modern power semiconductors in power converter technology] by W. Bölsterling et al., etz, vol. 114 (1993), issue 21, pages 1310–1319 discloses power converter circuit arrangements which comprise a plurality of switch modules which can be switched on and off. Particularly concerned here are IGBT modules (IGBT=Insulated Gate Bipolar Transistor) having a plurality of parallel-connected IGBT semiconductor chips per module.

The gate, anode and cathode terminals of the individual semiconductor chips are normally connected in parallel via connecting wires and connected to corresponding printed conductors which form the module terminals. Bonding wires are normally used as connecting wires.

IGBT modules of higher power virtually always consist of a larger number of such parallel-connected semiconductor chips, in order to be able to achieve the required current carrying capacity. The IGBT modules installed in a multiphase power converter can be damaged by blocking failure of an individual chip. The semiconductor substrate of such a chip breaks down and subsequently represents a short circuit. In order to avoid damage to the entire installation, protective devices are provided which detect a short circuit of a chip and immediately switch off the power converter. A defect in an individual chip thus paralyzes the entire installation. Apart from the repair costs, the operational interruptions arising thereby can be very expensive for the user in some circumstances.

SUMMARY OF THE INVENTION

Accordingly, one object of this invention is to provide a novel method for fault correction in a power converter circuit arrangement which permits a higher availability of the installation and guarantees that in the event of failure of one or more semiconductor switch chips the entire installation is not put out of operation.

The core of the invention is thus that the connecting wires of those switch chips which have a possible defect and form a short circuit are deliberately severed.

One exemplary embodiment is distinguished in that the power converter circuit arrangement comprises a multiphase converter which is fed from a DC voltage source. After a defect, that is to say a short circuit, of a chip has been detected, in a first step all the switch modules of the phases are switched off. Subsequently, for example, the switch module, connected to the positive terminal of the DC voltage source, of a first phase is switched on for a specific period tc. If the short circuit is located in a chip of the module of the same phase connected to the negative terminal, the effect of the current flowing through this module is that in the period tc the connecting wires of the defective chip are severed. The point is that this chip must carry the entire current load, since the module itself is switched off. Generally, the connecting wires are therefore burned through. However, if the short circuit is in the module which is connected to the positive terminal, at first nothing happens at all. If, however, the module connected to the positive terminal is now switched off again and that connected to the negative terminal is switched on for tc, the connecting wires of a defective chip are severed in the module connected to the positive terminal. If the short circuit is not located in the first phase, the same procedure is performed with the remaining phases until the fault is corrected. If a fault which cannot be corrected is present, the installation is taken out of operation.

In a further variant, after the detection of the fault and the switching off of all the modules, the DC voltage source is switched off or discharged first of all, and the voltage is subsequently gradually increased to an optimum peak arc voltage. This peak arc voltage is then used to proceed further as explained above.

Further exemplary embodiments follow from the corresponding dependent claims.

The advantage of the design according to the invention resides in that a defect in one or more chips does not put the entire installation out of operation, but that after the completion of the method according to the invention said installation can be further used. In this case, the efficiency is not necessarily reduced, if this has already been taken into account when designing the power converter.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
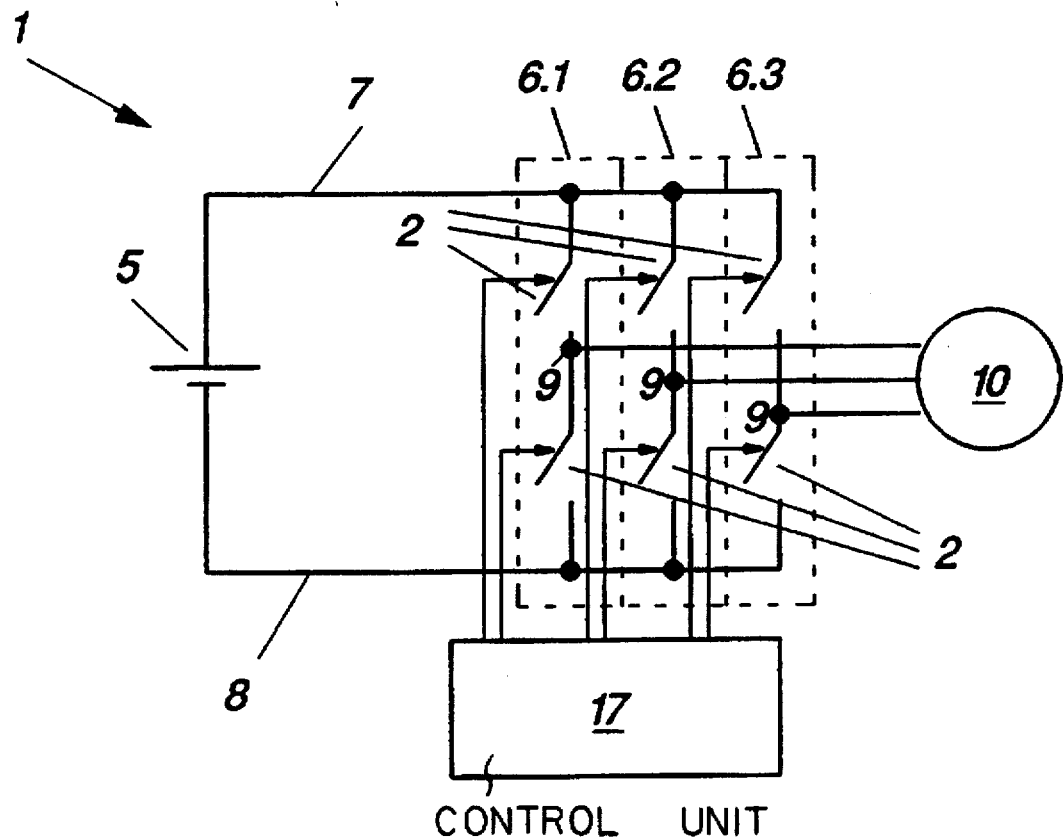
FIG. 1 shows a power converter circuit arrangement for which the method according to the invention is suitable.

The reference symbols used in the drawings are listed in summary together with their meaning in the list of designations.

DESCRIPTION OF THE PREFERRED EMBODIMENTS

Referring now to the drawings, wherein like reference numerals designate identical or corresponding parts throughout the several views, FIG. 1 shows a power converter circuit arrangement 1 in which the method according to the invention is advantageously applied. This is a 3-phase converter which is fed from a DC voltage source 5. The DC voltage source 5 can be, for example, a capacitor bank of a voltage link which is fed from an AC voltage grid via a rectifier. Each phase 6.1–6.3 of the converter comprises at least two switches 2. The switches 2, of which a first is arranged between the positive terminal 7 of the DC voltage source 5 and the load terminal 9 of the phase and a second is arranged between the load terminal 9 and the negative terminal 8 of the DC voltage source 5, comprise in each case at least one controllable switch element and a freewheeling diode 13 connected thereto in an inverse-parallel fashion. The controllable switch element comprises, for example, a switch module 14, but it is also possible to provide a plurality of switch modules 14 per switch 2. In order to increase the current carrying capacity, a plurality of modules are connected in parallel, and in order to increase the voltage handling ability they are connected in series. The load terminals 9 of each phase 6.1–6.3 are connected to a load, for example to a motor 10. A control unit 17 now switches the modules 2 of each phase on and off alternately, the phases 6.1–6.3 being driven with mutual phase shifts, with the result that a multi-phase AC voltage whose frequency can be set is generated across the load. The functioning of such a converter is adequately known from the prior art and does not need to be further explained at this juncture.

Figure 2:
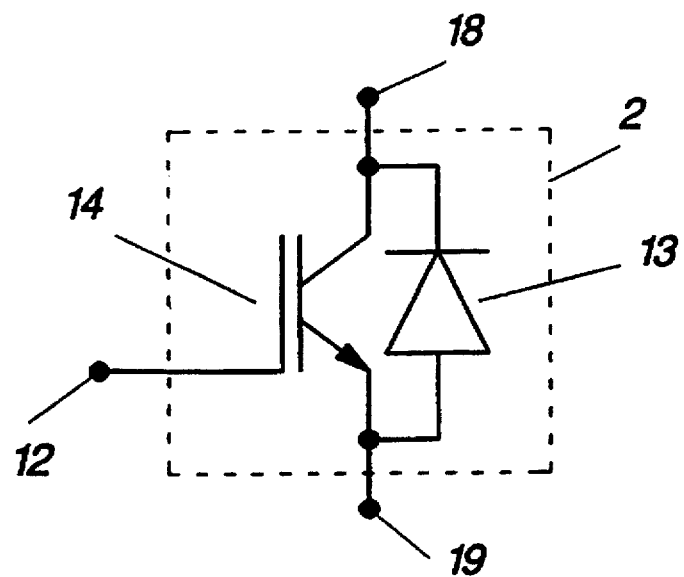
FIG. 2 shows the circuit diagram of a switch.
Figure 3:
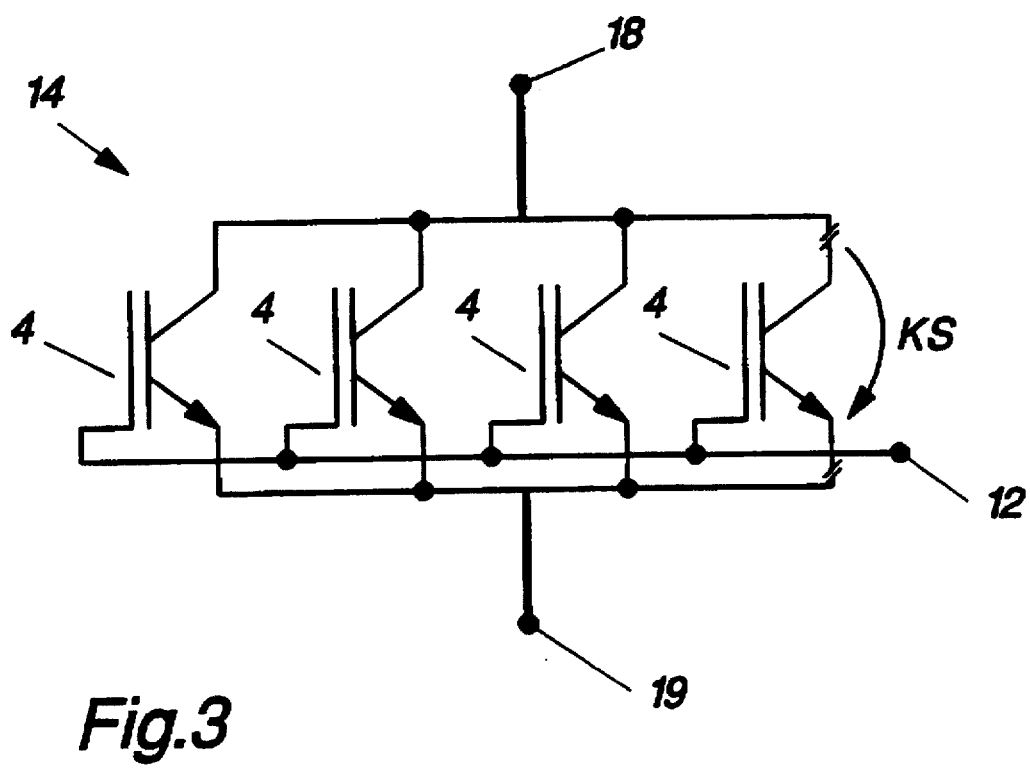
FIG. 3 shows the circuit diagram of a switch module.

FIG. 2 shows a switch 2 in detail. It comprises at least one switch module 14 having a freewheeling diode 13 connected in an inverse-parallel fashion. The switch module 14 preferably consists of IGBT switch elements or switch chips. The freewheeling diode 13 can also be integrated in the module 14, or be connected as a discrete component in an inverse-parallel fashion to the switch module 14. The module 14 itself comprises a gate terminal 12, an anode 18 and a cathode 19. For high-power applications, the module 14 is assembled for its part from a parallel circuit of semiconductor chips 4, that is to say from IGBT chips in the exemplary embodiment represented. This is shown in FIG. 3.

Figure 4:
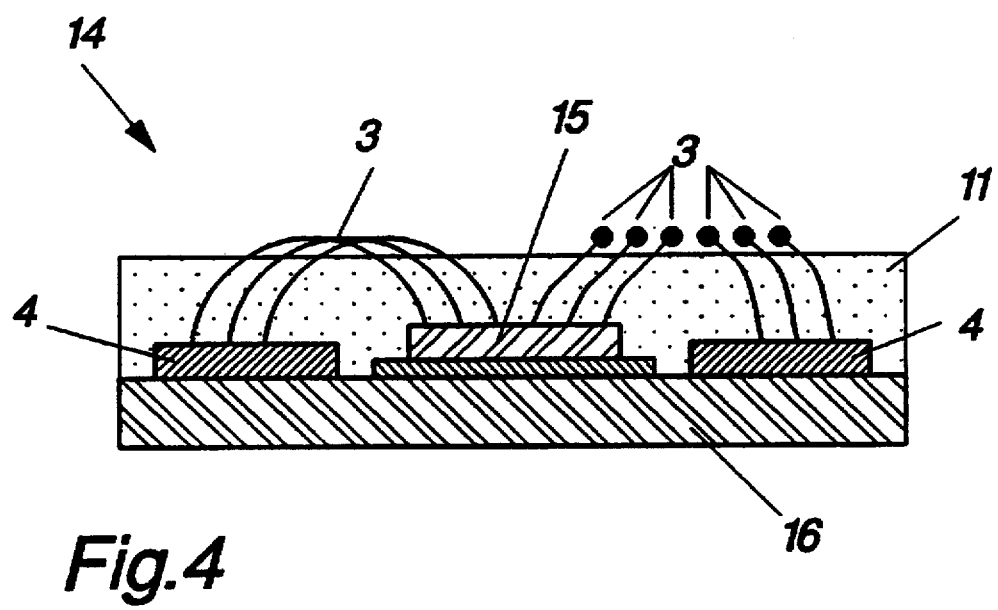
FIG. 4 shows a section through a switch module which is specifically suited for the method according to the invention.

As shown in FIG. 4, which represents a switch module 14 in section, the chips 4 are connected to printed conductors 15, for example, via connecting wires 3. These are generally so-called bonding wires. If, now, a chip 4 fails, then the entire module 14 is short-circuited. The short-circuit current is possibly very large and could destroy the module 14. For this reason, a protective circuit is provided which detects the fault and immediately switches off the remaining branches of the power converter in order to protect them against damage.

The control unit 17 of an implemented power converter circuit arrangement 1 generates a controlled igniting pulse pattern for driving the switch modules 14. This igniting pulse pattern is converted, for example, into optical signals and fed to the modules 14 via optical fibers. Optical transmission is preferred for EMC reasons and because of the electrical isolation. The optical signals are fed either to so-called gate units, which convert the optical signals into electrical ones again, or directly to the modules. In the latter case, the modules 14 must already have an appropriate transducer integrated. This is no longer problem with the intelligent power modules (IPM) currently available. The signal connection between the control unit and the modules is bidirectional, with the result that it is possible for information on the state of the gate unit or the modules to be reported back to the control unit. If it is detected that a module is defective, in the known methods, the control unit switches off the entire installation, in order to protect it against mechanical damage. It is prevented in this way that the fault in a module is developed and the entire installation is damaged. It is particularly important that in the case of a fault both modules of a phase are blocked. If this does not succeed, an explosion of the modules might have to be expected, since the resulting short-circuit current time integral is generally much larger than the corresponding permissible values of the modules. Although in the case of a successful protective intervention of the above type a consequential fault is avoided, there is then a permanent short circuit, with the result that the installation cannot be switched on again before the appropriate module has been exchanged.

Such interruptions, which can be very expensive, are avoided by means of the fault correcting method according to the invention. Very briefly, this is achieved owing to the fact that the connecting wires of a defective module are severed. To this end, all the switch modules 14 of each phase 6.1–6.3 are switched off in a first step. Subsequently, the module 14, for example of phase 6.1, which is connected, for example, to the positive terminal 7 of the DC voltage source 5 is switched on. If the short circuit is situated in the module 14, of the same phase, connected to the negative terminal 8, the entire current flows via the connecting wires 3 of the defective chip, because the relevant module is, after all, switched off. The current is now permitted to flow only for a period (burning time) tc, with the result that the connecting wires 3 are severed. The defective chip 4 is consequently electrically isolated from the remainder of the module, and the corresponding module 14 is ready for use again. Although it is possible for the efficiency of the module to be reduced thereby, this can be compensated for by appropriate design in which a portion of the chips is provided as a redundant component.

If the short circuit however, is not located in the module 14, of phase 6.1, connected to the negative terminal 7, nothing happens at all, since the circuit is, after all, open. In this case, the module 14 connected to the positive terminal 7 is switched off again, and in return the module 14 connected to the negative terminal 8 is switched on for a period tc. The connecting wires are severed in a way analogous to the above if this module has a short circuit.

If the defective module is not located in phase 6.1, the appropriate procedure is carried out with the remaining phases 6.2–6.3 until the fault is corrected.

Given the use of intelligent power modules which can independently transmit a fault to the control unit, the method according to the invention can be applied directly and specifically to the defective module. This permits further shortening of the operating interruption.

When the connecting wires 3 are designed as a fuse, it is advantageous to apply the link voltage directly to the severing of the connecting wires of a defective module. However, when the connecting wires 3, generally bonding wires, are not designed as a high-voltage fuse, their arc voltage is low (lower than 1000 V). For this reason, it is further advantageous when the peak arc voltage applied during the period tc is as low as possible. Otherwise the peak arc voltage is not sufficient to switch off the current and there is the risk that too much energy will be fed to the fault location. As a result, not only would the connecting wires 3 be severed, but also further damage would be caused.

This problem can now be prevented by firstly discharging the DC voltage source 5 or the link capacitor bank after switching off all modules 14 and subsequently recharging it to an optimum peak arc voltage and continuing the method according to the invention using this peak arc voltage. The optimum peak arc voltage can be calculated from the material properties of the connecting wires 3 and the period tc.

The period tc and thus the length of the applied current pulse as well as the level thereof (peak arc voltage) is fixed so as to produce a structure of the interrupted location which is capable of permanently blocking the peak arc voltage present at this location after resumption of normal operation.

A further measure for preventing uncontrollable damage during severance of the connecting wires 3 consists in that the connecting wires 3 are surrounded by an encapsulant 11. As FIG. 4 shows, in this case the connecting wires 3 project a little beyond the encapsulant 11. The connecting wires 3 are severed at this location. The encapsulant 11 in this case prevents further melting down of the wires 3 and thus uncontrolled spread of the applied burning energy to the module 14. Silicon gel, for example, can be used as encapsulant 11.

FIG. 4 shows the design of a switch module 14 in section. A number of switch chips 4 are applied, for example soldered to a baseplate 16. Furthermore, printed conductors 15 are provided which form the terminals of the modules 14. For the sake of simplicity, the Figure represents only the contacting of one side, for example the cathode side. The electrodes of the chips 4 are connected to the printed conductors 15 via connecting wires 3, generally bonding wires. IGBT chips 4 are preferably used. These have three main electrodes, an anode 18, a cathode 19 and a gate electrode 12. If it is an intelligent power module, possibly even more control and monitoring terminals are provided per module 14. However, it is also possible, of course, to use other semiconductor switches, thus MOS controlled thyristors (MCT), for example.

Optimum values for the period tc are a function, of course, of the peak arc voltage applied. Generally, it is a few microseconds. Values of between approximately 20 µs and 10 ms have proved themselves during trials. Particularly good results were achieved with values of between 100 µs and 10 ms. This permits the peak arc voltage to be applied to a module approximately every 1 ms. In the case of a three-phase arrangement, the result is thus a maximum of 6 operations per 1 ms. Added further to this are temporal delays for switching off the modules, and the interruption of the supply of energy as well as the gradual increase of the link voltage. Overall, however, the result is a total fault correction time which is in the region of fractions of seconds up to a few seconds. If, moreover, the optimum matching of the peak arc voltage is dispensed with and the connecting wires with the link voltage as determined by the installation are severed, the entire fault correcting operation lasts only a few ms and can therefore scarcely be detected.

The method according to the invention is not limited to the circuit arrangement explained above, but is used with advantage generally for all power converter circuit arrangements having modules consisting of a plurality of parallel-connected chips.

Thus, overall the invention provides a method for fault correction in a power converter circuit arrangement in which any short circuits in the semiconductor chips of the switch modules can be corrected without failure of the entire installation.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for fault correction in a power converter circuit arrangement, having switches consisting of a plurality of switch modules which can be switched on and off and which respectively comprise a plurality of switch chips connected in parallel via connecting wires, wherein the connecting wires of those switch chips which form a short circuit are selectively severable when a defect is detected in a module, wherein the power converter circuit arrangement comprises a multi-phase converter fed from a DC voltage source, provision being made per phase of two switches of which one each is connected between the positive terminal of the DC voltage source and a load terminal, and the other is connected between the load terminal and the negative terminal of the DC voltage source, wherein after the defect has been detected a) all the switch modules of each phase are switched off in a first step;

b) in a second step, the switch module, connected to the positive terminal, of a first phase is switched on for a period tc, and if the switch module connected to the negative terminal was not defective, the switch module connected to the negative terminal is then switched on for the period tc after the switch module connected to the positive terminal has been switched off again; and c) the second step for the remaining phase is repeated if the defective module was not included in the previous phase.

2. The method as claimed in claim 1, wherein the DC voltage source is discharged after the switching off of all the switch modules and subsequently charged to an optimum peak arc voltage.

3. The method as claimed in claim 2, wherein the period tc is between 100 µs and 10 ms and the peak arc voltage is selected to be as low as possible.

4. The method as claimed in claim 2, wherein said connecting wires are surrounded by an encapsulant, in particular made from silicon gel, the connecting wires partially projecting from the encapsulant.

5. The method as claimed in claim 2, wherein said switch chips comprise transistors having insulated gates.

6. The method as claimed in claim 1, wherein the period tc is between 100 µs and 10 ms and the peak arc voltage is selected to be as low as possible.

7. The method as claimed in claim 6, wherein said connecting wires are surrounded by an encapsulant, in particular made from silicon gel, the connecting wires partially projecting from the encapsulant.

8. The method as claimed in claim 6, wherein said switch chips comprise transistors having insulated gates.

9. The method as claimed in claim 1, wherein said connecting wires are surrounded by an encapsulant, in particular made from silicon gel, the connecting wires partially projecting from the encapsulant.

10. The method as claimed in claim 1, wherein said switch chips comprise transistors having insulated gates.

11. A method for fault correction in a power converter circuit arrangement, having switches consisting of a plurality of switch modules which can be switched on and off and which respectively comprise a plurality of switch chips connected in parallel via connecting wires, wherein the connecting wires of those switch chips which form a short circuit are selectively severable, wherein said connecting wires are surrounded by an encapsulant, in particular made from silicon gel, the connecting wires partially projecting from the encapsulant.

12. The method as claimed in claim 11, wherein said switch chips comprise transistors having insulated gates.

* * * * *